United States Patent

Allen et al.

[11] Patent Number: 5,852,712
[45] Date of Patent: *Dec. 22, 1998

[54] MICROPROCESSOR HAVING SINGLE POLY-SILICON EPROM MEMORY FOR PROGRAMMABLY CONTROLLING OPTIONAL FEATURES

[75] Inventors: Michael J. Allen, Rescue; Gregory K. Crain, Folsom; Stephen A. Fischer, Rancho Cordova, all of Calif.; Patrick P. Gelsinger, Aloha, Oreg.; David R. Gray, Hillsboro, Oreg.; Stuart T. Hopkins, Portland, Oreg.; Gustay Laub, III, Gold River, Calif.; Charles H. Lucas, Fair Oaks, Calif.; Richard D. Pashley, Roseville, Calif.; Babak Sabi, Portland, Oreg.; Joseph D. Schutz, Portland, Oreg.; David J. Shield, El Dorado Hills, Calif.; Stephen F. Sullivan, Rescue, Calif.

[73] Assignee: Intel Corporation, Santa Clara, Calif.

[ * ] Notice: The term of this patent shall not extend beyond the expiration date of Pat. No. 5,732,207.

[21] Appl. No.: 925,527

[22] Filed: Sep. 8, 1997

Related U.S. Application Data

[63] Continuation of Ser. No. 396,117, Feb. 28, 1995, Pat. No. 5,732,207.

[51] Int. Cl.⁶ .................................................. G06F 11/00
[52] U.S. Cl. .................................................. 395/182.03
[58] Field of Search ................... 395/182.03, 182.05, 395/182.08, 800; 371/10.2, 10.3; 711/121, 125, 133, 170

[56] References Cited

U.S. PATENT DOCUMENTS

| | | | |
|---|---|---|---|
| 4,266,270 | 5/1981 | Daniels et al. | 364/200 |
| 4,346,452 | 8/1982 | Groves | 364/900 |
| 4,460,997 | 7/1984 | Harns | 371/10 |
| 4,718,037 | 1/1988 | Thaden | 364/900 |
| 4,755,965 | 7/1988 | Mary et al. | 364/900 |
| 4,794,558 | 12/1988 | Thompson | 364/900 |
| 5,204,836 | 4/1993 | Reed | 365/200 |
| 5,218,707 | 6/1993 | Little et al. | 395/800 |
| 5,301,150 | 4/1994 | Sullivan et al. | 365/185 |
| 5,400,267 | 3/1995 | Denen et al. | 364/552 |
| 5,504,903 | 4/1996 | Chen et al. | 395/700 |
| 5,535,342 | 7/1996 | Taylor | 395/307 |
| 5,537,665 | 7/1996 | Patel et al. | 395/182.03 |
| 5,592,069 | 1/1997 | Dias et al. | 320/30 |
| 5,732,207 | 3/1998 | Allen et al. | 395/182.03 |

OTHER PUBLICATIONS

Bhavsar et al., "Testability Strategy of the Alpha AXP 21164 Microprocessor" IEEE, pp. 50–59, Oct. 1994.

Schultz et al., "A Microprogrammable Processor Using Single Poly Eprom" Integration, the VLSI Journal, v8 n2, pp. 189–199, Nov. 1989.

Motorola Semiconductors, Product Literature, Device MC68701, Microcomputer Unit (MCU), pp. 1–30, "Microcomputer with Eprom", 1984.

(List continued on next page.)

Primary Examiner—Joseph Palys
Assistant Examiner—Stephen C. Elmore
Attorney, Agent, or Firm—Blakely, Sokoloff, Taylor & Zafman LLP

[57] ABSTRACT

A CMOS microprocessor chip includes an on-chip single-poly EPROM that is process compatible with the CMOS process used to manufacture the microprocessor. The EPROM is used to store manufacturing and contract related data such as serial number, customer, and process related data such as wafer number test results, binning data, etc. This provides important information for quality and reliability control. The EPROM is also used to control selection of optional microprocessor features such as speed governing, pin-out and I/O bus interface configuration. A third use is for trimming of critical circuit elements and for cache redundancy fault control.

11 Claims, 11 Drawing Sheets

OTHER PUBLICATIONS

R Kazerounian, "A Single Poly EPROM for Custom CMOS Logic Applications", Proceedings of the IEEE 1986 Custom Integrated Circuits Conference, May 12–15 1986.

K. Yoshikawa, et al., "An EPROM Cell Structure for EPLD's Compatible With Single Poly–Si Gate Process", IEEE Transactions on Electron Devices, V.37, No. 3, pp. 675–679, Mar. 1990.

N. Najafi, et al., "An Organization and Interface For Sensor–Driven Semiconductor Process Control Systems", IEEE Transactions on Semiconductor Manufacturing, vol. 3, No. 4, 11–90 pp. 230–238.

MICROPROCESSOR HAVING SINGLE POLY-SILICON EPROM MEMORY FOR PROGRAMMABLY CONTROLLING OPTIONAL FEATURES

This is a continuation of application application Ser. No. 08/396,117 filed Feb. 28, 1995, now U.S. Pat. No. 5,732,207.

FIELD OF THE INVENTION

This invention relates to microprocessor structures augmented by a single polycrystalline-silicon (poly-silicon) erasable programmable memory for providing ancillary functions such as product identification and control of product functional features, the poly-silicon EPROM being process compatible with CMOS integrated circuit microprocessor manufacturing technology.

BACKGROUND OF THE INVENTION

EPROMs have traditionally been manufactured using double poly-silicon floating gate memory cells (flash memory cells). Because the manufacture of these cells requires two layers of poly-silicon, incorporation into large scale integrated (LSI) circuit chips, such as microprocessor chips, has not been practical. The second poly-silicon layer complicates the process, lowers yield, and increases manufacturing costs out of proportion to the value added by the features that such an EPROM could support. The advent of practical single-poly-silicon (or single-poly, for short) EPROMs, the incorporation of an ancillary function memory makes it possible to include, on the microprocessor chip new functions that can avoid increased manufacturing costs while increasing product convenience and features available to the user.

An electrically erasable and programmable single-poly EPROM cell and memory array is described by Sullivan et al. in U.S. Pat. No. 5,301,150, entitled "Flash Erasable Single Poly EPROM Device."

A three-dimensional cross-sectional view of an electrically programmable and electrically erasable single-poly memory cell 120 (as taught by Sullivan et al. in U.S. Pat. No. 5,301,150) is shown in FIG. 1. Memory cell 120 comprises transistor 124, control gate capacitor 125, erase capacitor 123, and select transistor 160. Region 163 serves as the source of transistor 124 and drain of transistor 160. Select transistor 160 includes select gate 161, select gate oxide 162, source 126 and drain 163.

Memory cell 120 is programmed by bringing both n-wells 131 and 151, to a potential in the range of approximately 7 volts through contacts 142 and 143 respectively. Drain 127 is biased high to a potential in the range of approximately 7 volts, and source 126 is grounded. Select transistor 160 is turned on by applying a potential of approximately 3.3 volts to select gate 161 through control 144 which causes current to flow through transistor 124. This causes avalanche breakdown to occur in channel 130 and generate hot electrons to penetrate gate oxide 129 and to be attracted to floating gate 128b.

Memory cell 120 is erased by applying a potential (7–10 volts) to n-well 151. The potential is applied through erase contact 143 while n-well 131, source 126 and drain 127 are grounded through contacts 141 and 140 respectively. This causes most of the applied voltage to fall across oxide 155 which causes electrons to tunnel from plate 128c to n-well 151.

Memory cell 120 is read by applying a potential between source 126 and drain 127. Control gate capacitor 125 is turned-on by applying a read potential of approximately 3.3 volts to n-well 131 through contact 142. Transistor 160 is turned on by applying approximately 3.3 volts to select gate 161. If memory cell 120 is unprogrammed (i.e., no charge on floating gate 128b) transistor 124 will be on and will conduct current that can be sensed. If memory cell 120 is programmed, transistor 124 will be off and will not conduct current.

FIG. 2 shows a schematic circuit equivalent of memory cell 120 in which the indicia correspond to those used in FIG. 1. The resistor, R, of FIG. 2 is a load resistor with a typical value of 1000 ohms.

FIG. 3 shows a four cell memory in which each memory cell is a memory cell 120. The cells labeled A and B are in one column (bit line) and cells C and D are in another column. Cells A and C are in one row (word-line) while B and D are in another row. If cell A is being programmed, lines 142 and 144 are bit at ≈8 and ≈3 volts respectively and applied to the memory cells of that row, turning on both cells A and C. The source of cell A is grounded by applying ≈3 volts to transistor 170a. The bottom row is turned off by grounding line 144b while holding 142b at ≈8 volts to prevent program disturb. In a similar fashion any cell of the memory array of FIG. 3 may be selected for programming, read or erase by applying the appropriate potentials as previously described.

Arrays of these single-poly cells are readily incorporated into CMOS microprocessor chips because of manufacturing process compatibility and thus provide the means for a novel microprocessor architecture that offers new and useful features.

SUMMARY AND OBJECTS OF THE INVENTION

A microprocessor architecture, for implementation using a CMOS process, includes a single-poly EPROM and logical controllers for programmably controlling an optional set of features that, together with the microprocessor core and EPROM, are included in the basic chip. This provides greater uniformity of product at the manufacturing level without loss of flexibility to meet a variety of cepstrum applications.

A further object is to provide a means for tracking each microprocessor through the total manufacturing and test cycle by recording key production and test data in the single-poly EPROM.

Another object is to improve the yield of the manufacturing process by using an on-chip single-poly EPROM to program memory fault corrections.

Another object is to improve the yield of the manufacturing process by using an on-chip single-poly EPROM to programmably adjust critical current parameter by electrically switched circuit components.

Another object is to provide a programmable pin-out configuration using an on-chip single-poly EPROM memory, thereby reducing the number and variety of masks and chips.

Another object is to provide a programmable bus interface by using a single-poly EPROM to control a programmable logic bus interface.

BRIEF DESCRIPTION OF THE DRAWINGS

The present invention is illustrated by way of example and not limitation to the figures of the accompanying drawings, in which like references indicate similar elements and in which.

DETAILED DESCRIPTION

A. Introduction

Figure 1:
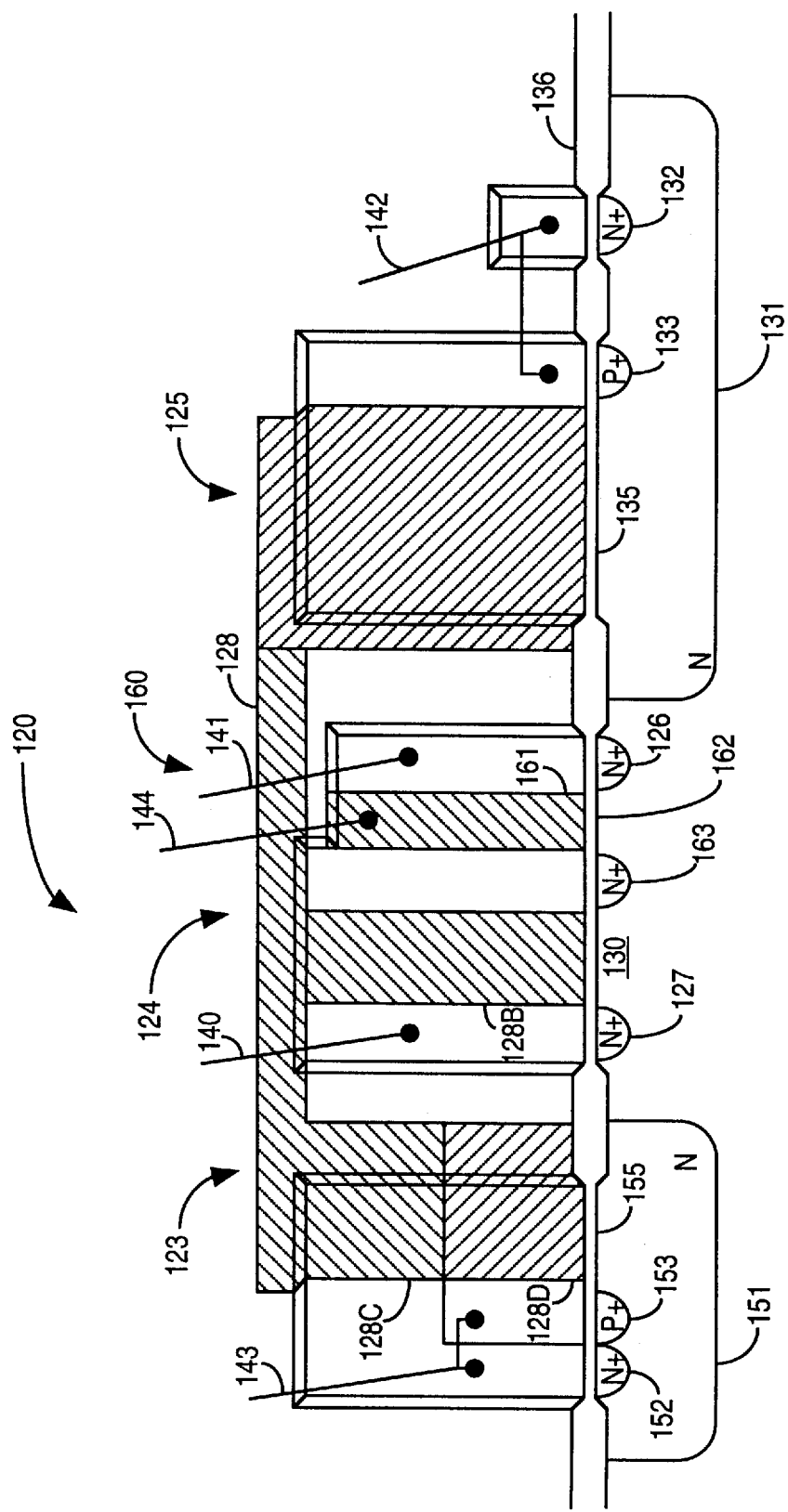
FIG. 1 shows a three-dimensional cross-sectional view of a prior art single-poly cell.
Figure 2:
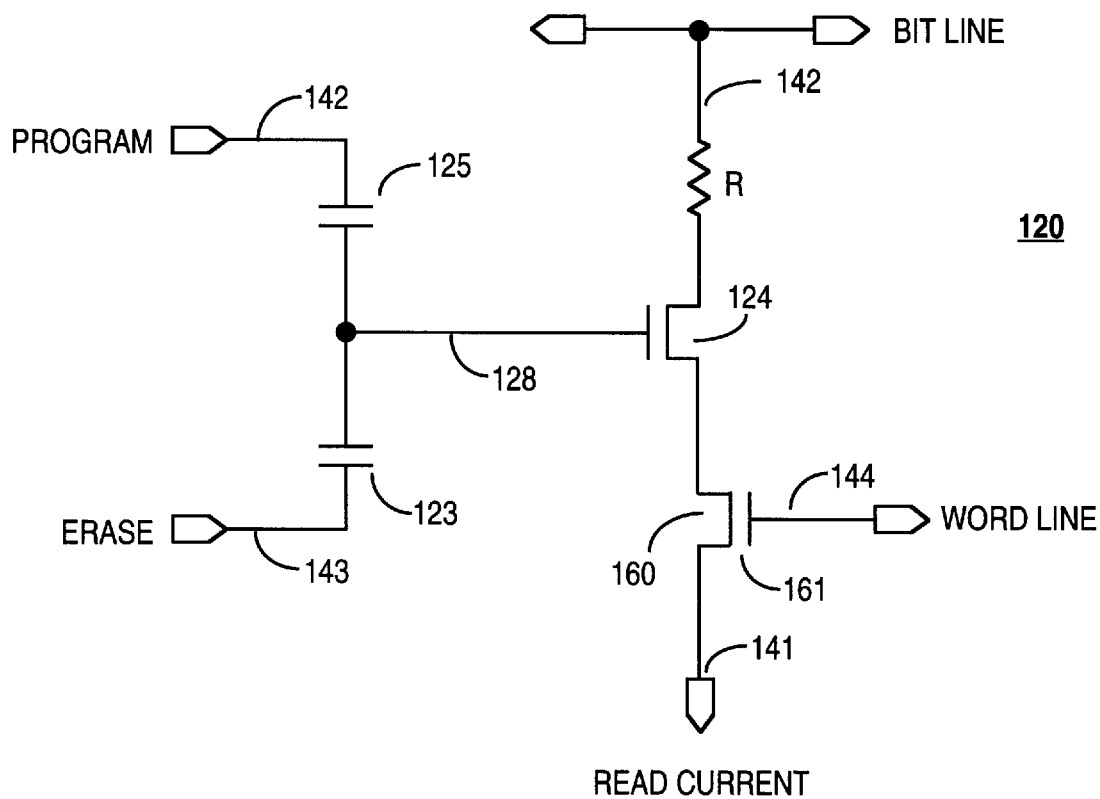
FIG. 2 is a schematic representation of a prior art single-poly cell.
Figure 3:
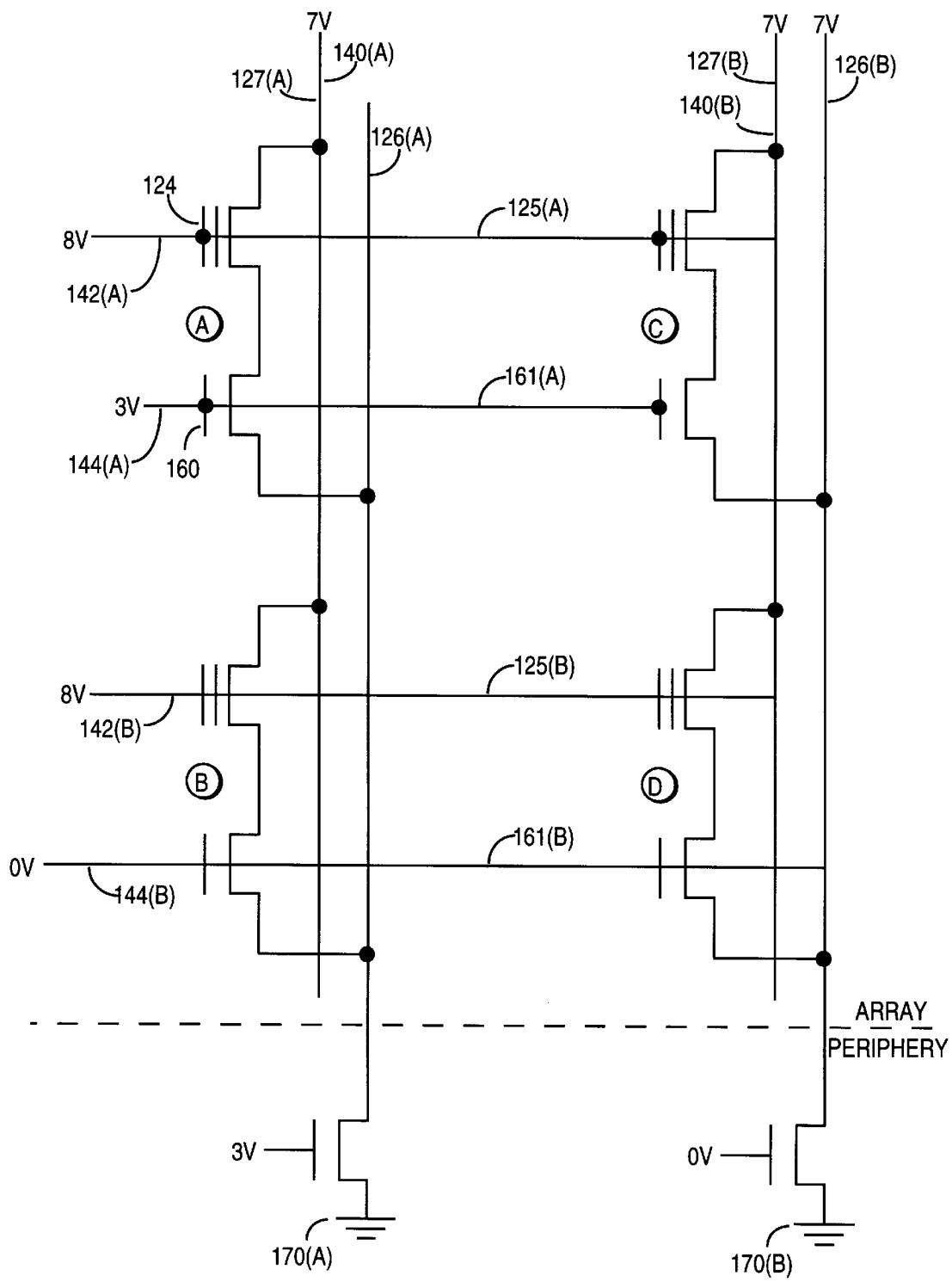
FIG. 3 shows a prior art single-poly memory cell array.
Figure 4:
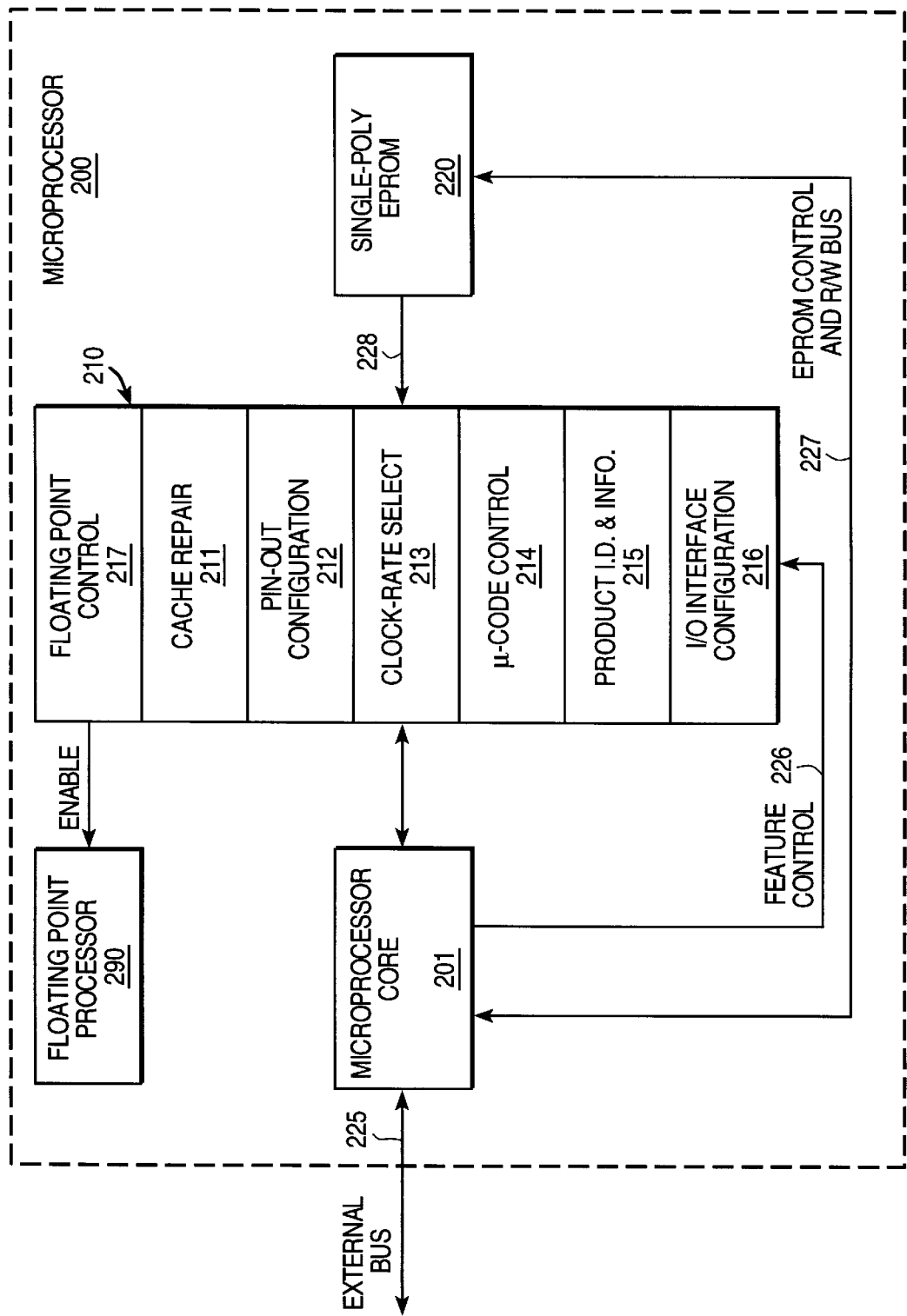
FIG. 4 is a functional block diagram of a microprocessor augmented by a single-poly EPROM for providing ancillary functions and features.

An augmented microprocessor chip 200, shown in FIG. 4, has an on-chip single-poly EPROM 220 for support of optional programmable microprocessor features and configurations. EPROM 220, both electrically programmable and erasable, is typically factory pre-programmed to include customer contracted features and configuration such as cache memory capacity, pin-out configuration, clock-rate, microprogrammed processor features, and I/O bus interface. Element 210 is a collection of adapters and controllers that operate on instructions received from microprocessor core 201 through single-poly EPROM 220 for implementing, for example, the functions of elements 211–217 that include: cache repair 211, pin-out configuration control 212, clock-rate selection 213, microcode control 214, product identification number and information 215, input/output (I/O) interface configuration 216 and floating point control 217.

Access to single-poly EPROM 220 and adapter/controller 210 is through external bus 225 and microprocessor core 201. The microprocessor of core 201 interprets the incoming request and issues an EPROM access control signal and address on read/write bus 227 and activates a specified controller unit of adapter/controller 210 that accepts the read output control signals on lines 228. The read output signals are interpreted by the specified controller unit which issues the required controller signals to activate a controllable (optional) microprocessor core functional unit selected.

Upon system initialization, all optional controllable microprocessor core functional units are reset to an inoperative state and then those previously selected, as indicated by data stored in EPROM 220, are activated and initialized.

Delivered microprocessors may be field retrofitted to accommodate product upgrades either to meet contracted commitments or to provide new features. New features may include optional features that are designed and manufactured into the delivered product but not required by contract for delivery. This would provide less variation in product at the manufacturing phase while offering users maximum flexibility in choice of contracted product as well as upgraded performance by subsequent activation of optional features not contracted initially.

Similarly, manufacturing data could be stored that would provide a complete history of the manufacturing process from wafer to packaged product, including test and binning data. This would form the basis for better manufacturing quality and yield.

The inclusion of a single-poly EPROM can support a number of field selectable features including:
(1) programmable bus interface,
(2) pin-out selection,
(3) field upgradable operating feature microcode, and
(4) selectable clock rates.

Manufacturing and production-oriented features include:
(1) production data storage,
(2) customer and contract information storage,
(3) test and binning data storage,
(4) repair of memories,
(5) microcode storage to avoid mark redesign, and
(6) trimming of analog circuits.

B. Field Selectable Features

B.1 Programmable Bus Interface

Current industrial practice requires that a microprocessor be designed for a specific bus, and if multiple bus architectures are required, multiple masks sets are designed, one for each bus type, or bond-out options are used to select between them. The design of multiple masks and the manufacture of a multiplicity of microprocessors each with differing bus interfaces adds manufacturing cost and reduces flexibility. The second strategy (bond-out option) is expensive in terms of the silicon area required. Also, mask redesign may be required to accommodate changes in bus specifications. By providing a bus interface logic array that is programmable by means of an on-chip single-poly non-volatile memory, a silicon microprocessor chip can be changed after test for configuring the microprocessor with a specific bus interface.

Figure 5:
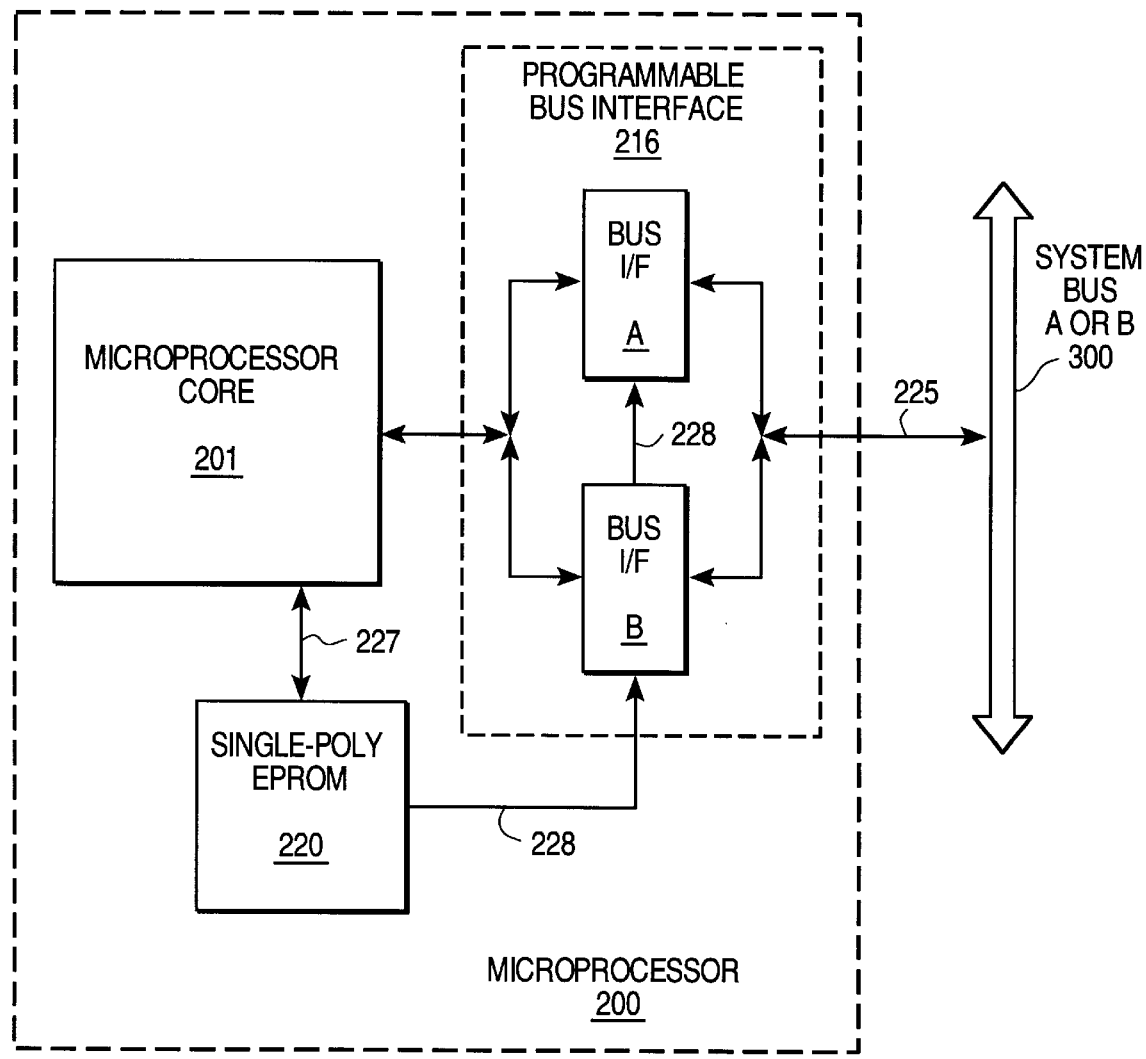
FIG. 5 is an example of a two-bus Programmable Bus Interface.

FIG. 5 is an example of a two-bus Programmable Bus Interface 216 associated with microprocessor core 201 and single-poly EPROM 220 on an augmented microprocessor chip 200. Bus interface (I/F) A or B may be activated for use with system bus A or B. Single-poly EPROM 220 supplies, on lines 228 all of the initializing code required to operate the interface selected by microprocessor core 201 using control lines 227. All microprocessor core 201 output signals are supplied to unit 216 where they are logically manipulated by Bus I/F A or B to match the operating specifications of either the A or B System Bus 300.

B.2 Programmable Pin-Out

Microprocessors and other large scale integrated (LSI) circuits use bond pads to select different package pin-out options. As the number of options increase, the area penalty for this approach becomes significant. A programmable approach would provide manufacturing flexibility by being able to change the pin-out if incorrect or, as required, to minimize inventory by matching pin-out to contract requirements at test. This is accomplished by providing an on-chip non-volatile single-poly EPROM for storing pin-out data. A single 8-bit byte would allow decoding of 64 pin-outs so that any of 64 pins could be altered to create a secondary function.

Figure 6:
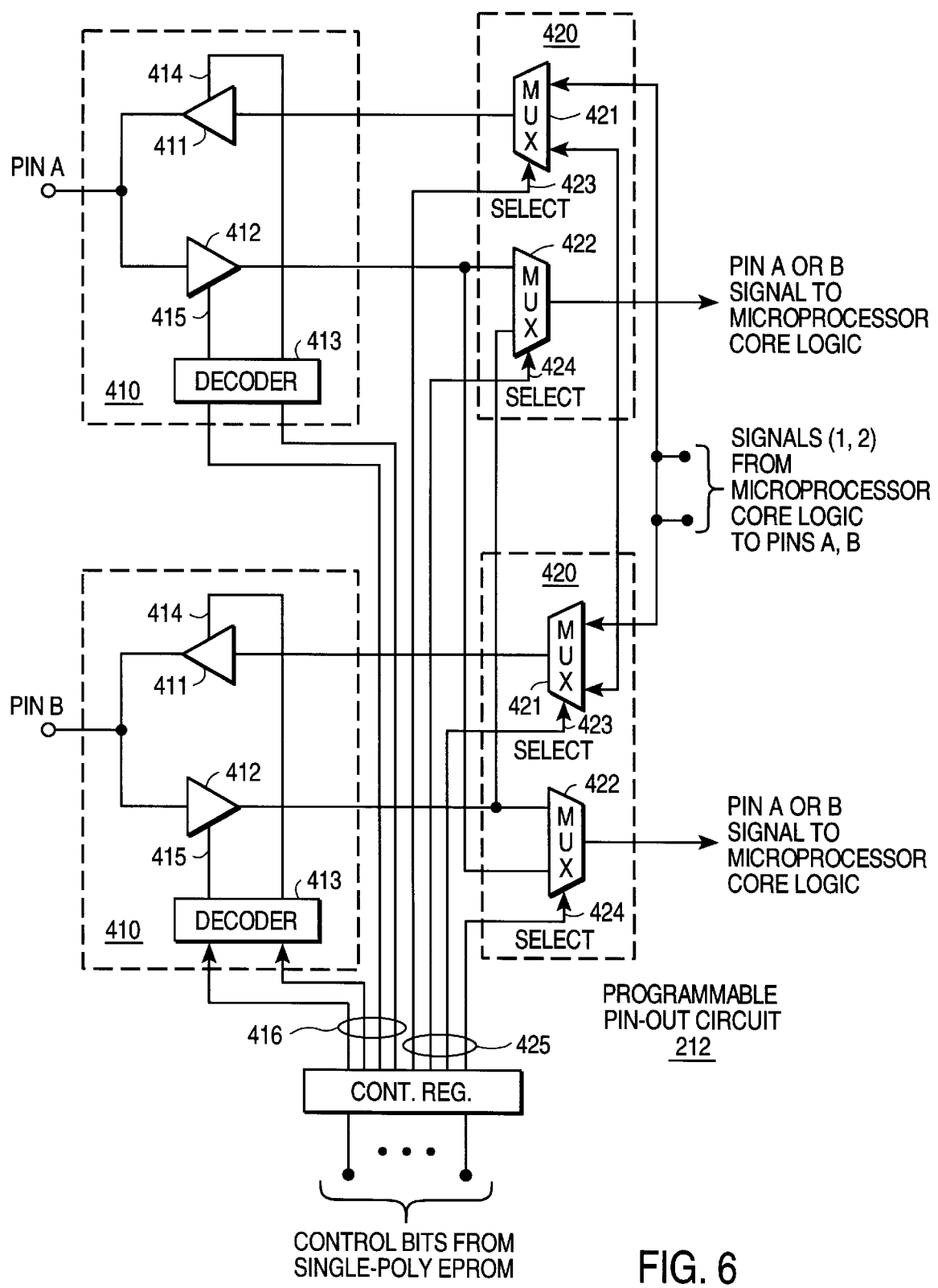
FIG. 6 shows an example of a Programmable Pin-Out Unit.

FIG. 6 shows an example of a programmable pin-out circuit 212 suitable for control by an on-chip single-poly EPROM. For the sake of clarity, the example only shows two input/output pins (PIN A, PIN B), two signals ((1), (2)) from microprocessor core 201, and two signals from input/output pins A and B. Circuit 212 includes two input/output programmable pin units 410, one each connected to pins A and B, and two programmable microprocessor core logic signal selectors 420.

Input/output programmable per unit 410 includes a tristate buffer 411 for driving a signal on to the associated input/output pin A or B. The floating (high impedance) state is selected by control line 414 from decoder 413. The state of pin A or B is sensed by tristate buffer 412 and the selection of the floating state is controlled by decoder 413, line 415. Thus, control lines 414 and 415 permit the selection of one of four operating modes: open pin mode (buffer 411 floating, buffer 412 floating; output mode (buffer 411 active, buffer 412 floating); input mode (buffer 411 floating, buffer 412 active; and output-input mode (buffers 411 and 412 both active). The modes of each input/output programmable pin unit 410 are controlled by input lines 416 whose state is determined by the control bits supplied by single-poly EPROM 220, stored in control register 430 and supplied to input/output programmable pin units 410 by lines 416.

Microprocessor core logic signal selectors 420 provide additional flexibility by allowing input signal (1) or (2) to be selected for output on either pin A or B by controlling the states of select lines 423. MUX 422 selects for output to the microprocessor core either outputs of tri-state buffers 412 by controlling the states of select lines 424. The programmable bits required for control of the MUX units are provided from single-poly EPROM to control register 430 and then delivered to microprocessor core logic signal selectors 420 via lines 425.

It will be recognized by those practicing the art that the principles expounded in the above description of FIG. 6 may be expanded to interconnect additional pins and microprocessor core logic as required for any particular pin-out options.

B.3 Field Upgradable Operating Features

Typically, microprocessor operating features are hardwired into the device and cannot be changed after shipment to the field. With the use of on-chip memory, selection of a feature can be enabled or disabled after shipment, and even while installed in a user system. For example, floating point arithmetic capability could be inherent in the delivered product but not required by contract nor paid for. However, if the user should require the added capability after delivery, the floating point arithmetic process capability could be activated rather than requiring physical replacement by another microprocessor by including programmable feature elements, such as a floating point processor 290 that can be enabled or disabled by floating point control 217 based on control data stored in an on-chip single-poly EPROM.

B.4 Selectable Clock Rates

By using an on-chip single-poly EPROM, microprocessor chips can include speed selection capability. Speed selection control is desirable because of two primary considerations: first, greater manufacturing flexibility results at binning during test, when it is necessary to ship higher performance chips to satisfy a lower priced and lower speed contract requirement; and second, to promote long term reliability by not allowing chips to operate at rates in excess of the specified speed. (For example, it is possible for a short time for a device to run faster than the connecting traces are capable of supporting.) A speed governor can control the critical speed path or paths of a microprocessor by programmably connecting capacitive loads to critical nodes to slow the paths to within specification.

Figure 7:
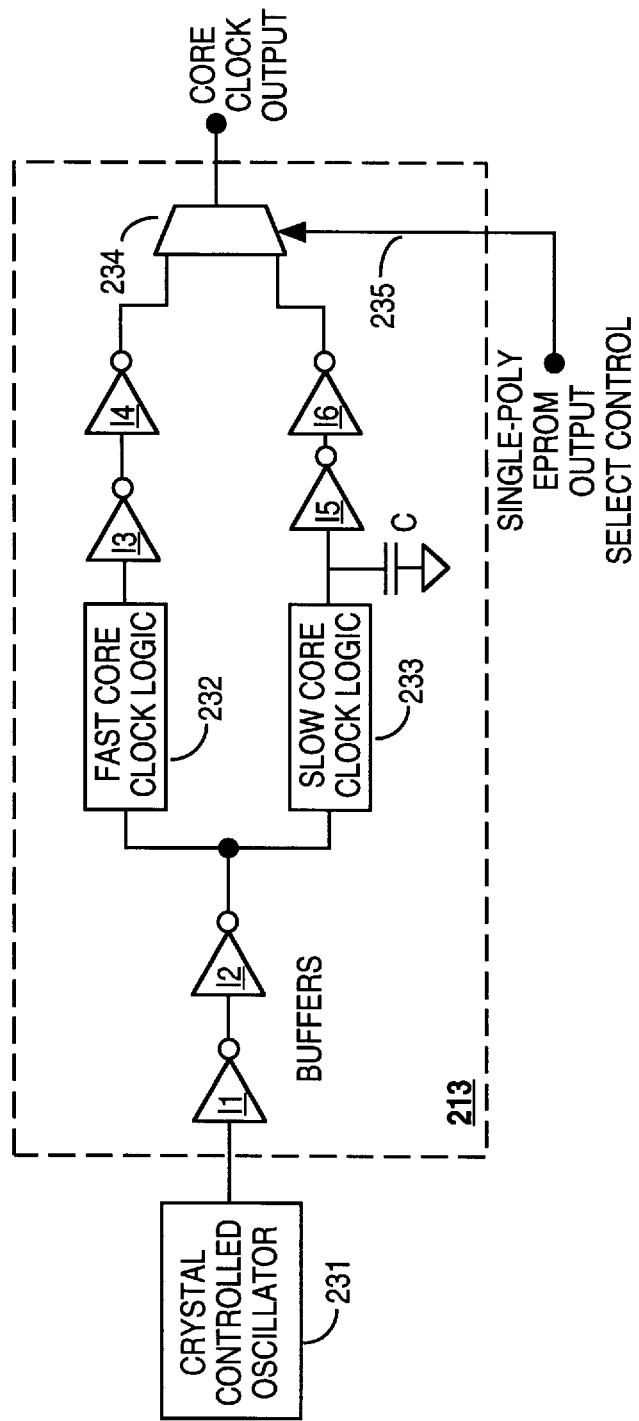
FIG. 7 is a block diagram of a fast and slow Programmable Core Clock Controller.

FIG. 7 shows Programmable Core Clock Controller 213 for operating microprocessor core 201 at two different rates. Crystal controlled oscillator 231 or other clock oscillator source provides an input signal through buffer I1 and I2. Fast core-clock logic 232 generates a synchronous high speed clock signal (e.g. 100 MHz) from source 231 and outputs the clock signal through buffers I3 and I4 to an input of selector 234. Similarly, slow core-clock logic 233 provides a low clock rate (e.g. 33.3 MHz) through deglitching capacitor C and buffers I5 and I6 to another input of selector 234. The fast or slow clock is selected for output as the core-clock by control-line 235 that is controlled by single-poly EPROM 220.

Figure 8:
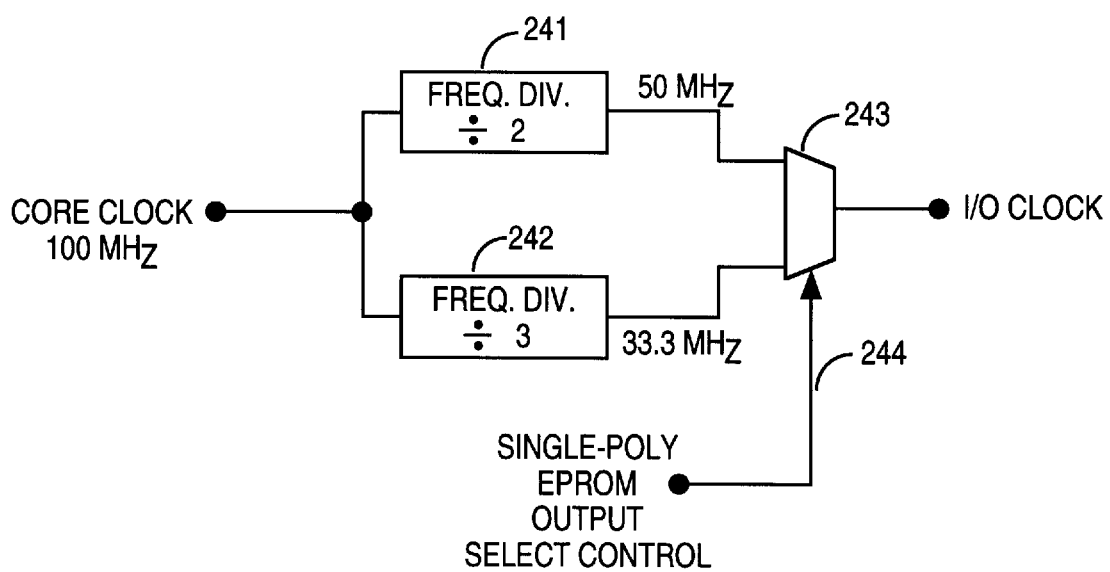
FIG. 8 is a block diagram of a two-rate Programmable I/O Clock Controller.

FIG. 8 shows a similar arrangement for providing a selectable I/O clock-rate that is slower than the core-clock (e.g. 100 MHz). The 100 MHz core-clock, in this example, is applied to frequency dividers 241 and 242 for producing at the respective outputs a 50 MHz and a 33.3 MHz clock signal. The two clock signals are applied as inputs to selector 243 that is controlled by line 244. The single-poly EPROM 220 selects the appropriate clock-rate for outputting as the I/O-clock.

In this manner, both the core-clock and I/O-clock rates may be controlled to serve different price markets using the same silicon chip.

C. Manufacturing and Production Features

C.1 Production and Contract Data Storage

Currently, it is difficult to trace the history of a microprocessor chip that is shipped to the field. A serial (ID) number, assigned at the factory, would allow tracing of the chip to a specific contract. This would enable identification of the purchaser (of interest for recovery of stolen parts), contract performance specifications including speed grade, and any other contractual performance restrictions. A unique number assignment would require up to 8 bytes of storage.

Also, production information can be stored with each microprocessor tracing the manufacturing history including test data logging of part performance, lot number, revision level, assembly site and other useful quality control and reliability analysis information.

An on-chip single-poly EPROM can provide the required memory to provide these manufacturing and production features.

C.2 Cache Redundancy

On-chip cache memories provide significant performance improvement at the expense of using a large silicon area. In general, performance improves with increasing cache size but yield decreases. The point at which decreased yield costs offsets performance improvement value can be shifted by using a single-poly EPROM to repair cache defects and increase the effective yield of larger caches. Presently, no cache redundancy techniques are used except for laser based techniques which are difficult to implement in production environments. Because single-poly EPROMs are process compatible and electrically programmable, the use of single-poly EPROMs for cache redundancy is compatible with standard test environments. Erasability provides additional flexibility. A programmable cache redundancy element is used in selecting redundancy rows and columns. For example, the redundancy element can be an extra static random access memory (SRAM) row or column that can be switched-in as a replacement for a defective row or column in the cache memory.

Figure 9:
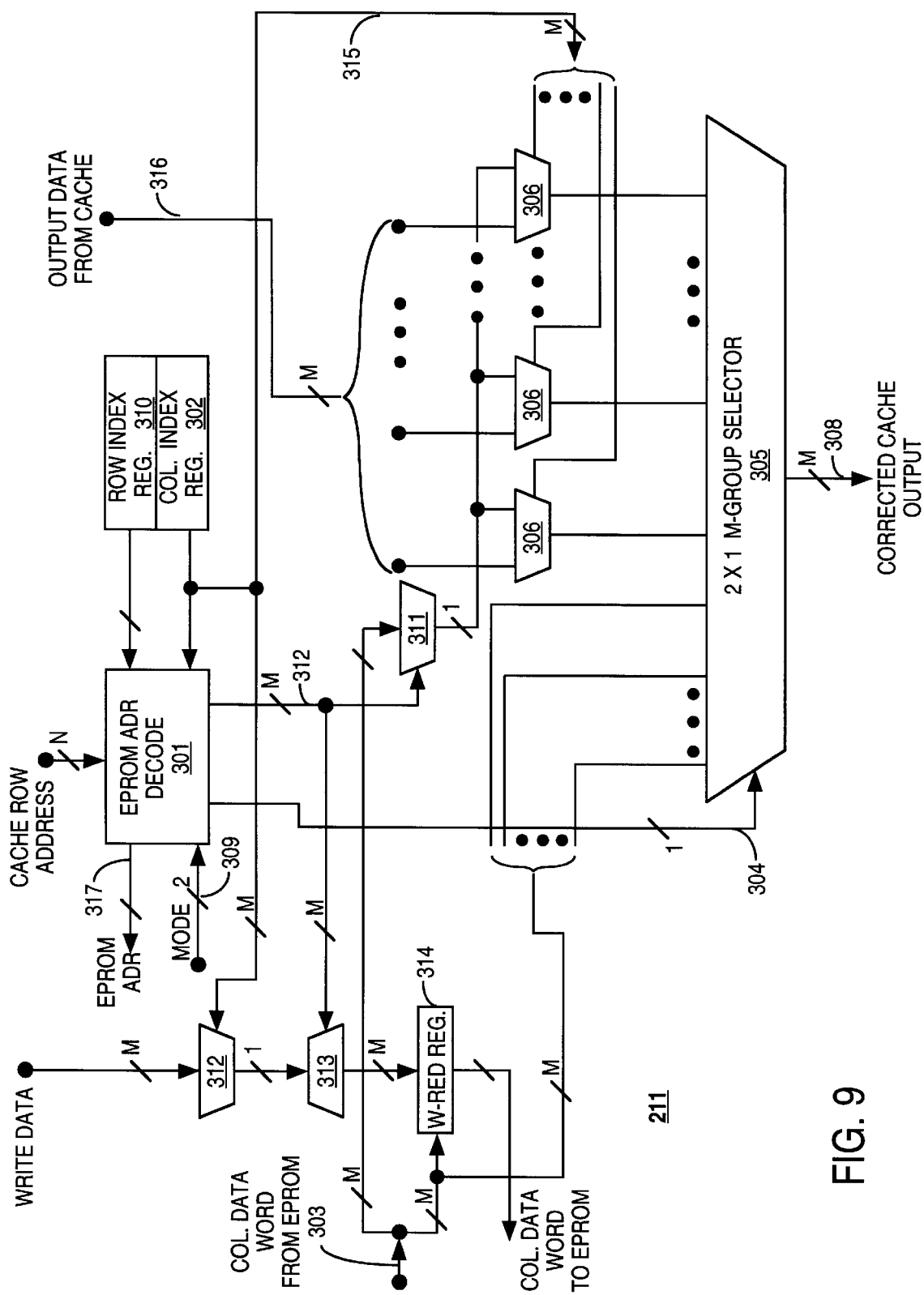
FIG. 9 is a Cache Redundancy Controller using a single-poly EPROM.

FIG. 9 shows an example of Cache Redundancy Controller 211 for correcting a defective row (word) or column of a cache memory in Microprocessor Core 201 by using single-poly EPROM 220.

The cache row address is supplied to the cache memory of microprocessor core 201 and to EPROM address decode unit 301. If the redundancy cache repair unit 211 is in the row-repair mode as indicated by the state of line 309 that is controlled by Microprocessor Core 201, the cache row address is compared with a stored address index of the defective cache row and if a match exists the address is remapped by unit 301 into the proper word address of EPROM 301 where the corresponding word is located. The remapped address is stored in row index register 310. If the operation is a read the EPROM word is read-out and supplied to line 303 of unit 211. A control bit on line 304 is supplied by EPROM Address Decode Unit 301 that controls selector 305 and causes the word from EPROM to appear at cache memory output lines 308. If it is a write operation, the data is written into EPROM 220 at the address provided by EPROM address decode unit 301.

If a column is to be repaired by Redundancy Cache Repair unit 211, the column of data is stored in one or more EPROM 220 words. Address Decode unit 301 uses the cache row address and the defective column index stored in Register 302 to map the EPROM 220 word address and cause the contents to be delivered to Selector 311 that selects the proper bit for the defective column replacement by using the Address Decode 301 Bit Select Line 312 to choose 1-out-of-M bits of the word supplied by EPROM 220 on Line 303. The output bit of Selector 311 is supplied as an input to each of M 2×1 Selector 306 units. The other set of inputs are from the addressed word of core cache memory. Column index register 302 selects the Selector 306 unit that is to pass the corrected bit from Selector 311 by using control lines 315. Selector 305 selects either the set of lines 303 or the output of the set of selectors 306 for outputting the corrected core cache data. The selection is made by Address Decode Unit 301 based on prior information indicating a row or column redundancy correction.

When writing to cache and using this redundancy correction system for column correction, the data word sent to cache is also supplied to Selector 312. The EPROM word address output Line 317 is used to select the proper word from EPROM which is then loaded in Write-Redundancy Register 314. Using the Column Index Register 302, a data bit corresponding to the defective column is selected and passed on to Demultiplexer 314 causing the bit value to be stored in the bit position of M-bit Write-Redundancy Register 314 as indicated by output Lines 312 of EPROM Address Decode Unit 301. The output of Register 314 is written back into the cache memory of the microprocessor core 201.

C.3 Analog Circuit Trimming

Analog circuits, which may include phase-locked-loops (PLLs) voltage references, and analog-to-digital or digital-to-analog circuits, are currently trimmed by making mask changes. This is a costly and time consuming method because of the many iteration that may be required. Programmably controllable circuit elements, such as resistors and capacitors, connected to selected nodes would allow changes to be made electrically and thereby greatly speeding-up the manufacturing process while gaining tighter control over circuit parameters. A single-poly EPROM provides a non-volatile memory for programming the control for switching the resistor and capacitor elements at the critical circuit nodes for achieving the desired circuit performance. For example, a set of resistors can be arranged in parallel as a load with programmable connectors between them. By varying the connections connecting one or more selected resistors of the set in parallel, a large variation in effective resistance is readily achieved.

Figure 10:
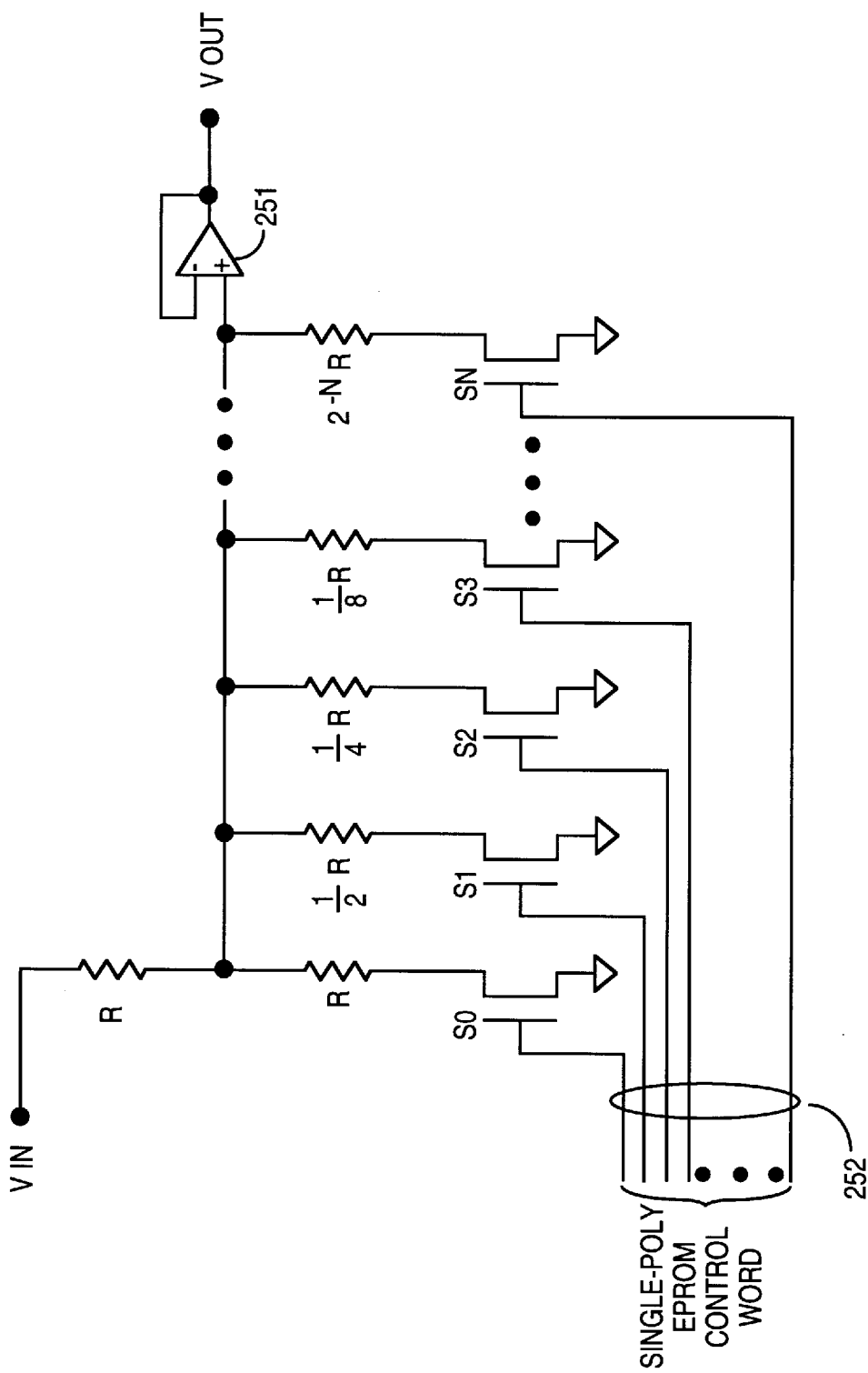
FIG. 10 shows an example of a Programmable Reference Voltage Trimming Circuit.

FIG. 10 is an example of a Programmable Reference Voltage Trimmer circuit that generates $V_{OUT}$ as a precise fraction of input voltage $V_{IN}$. The fraction value, $V_{OUT}$, is produced by controlling the conductivity of FET transistor switches S0-SN by the signal from single-poly EPROM 220 over Control Lines 252. By causing various switches to conduct, a wide-variety of voltage ratios are applied to Voltage Follower Amplifier 251.

Figure 11:
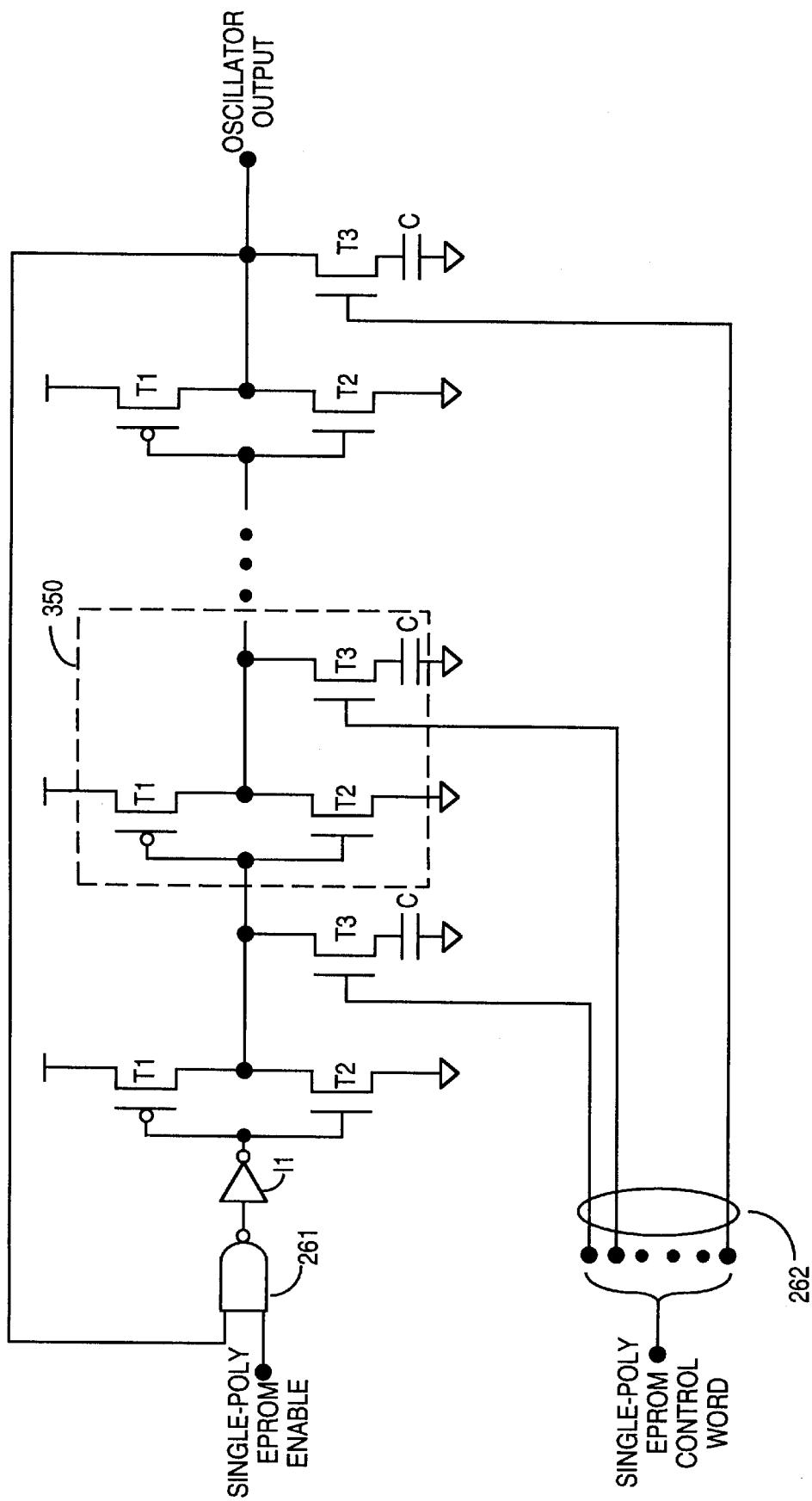
FIG. 11 shows a Programmable Ring Oscillator.

FIG. 11 is an example of trimming a Programmable Ring Oscillator circuit made-up of a chain of Inverters 350, each Inverter 350 comprising a P-type (T1) and an N-type (T2) CMOS transistor pair. The output of each inverter is applied to a switchable capacitor circuit connected between the output and signal ground. Each switchable capacitor circuit has a capacitor, C, connected in series with an N-type transistor, T3, with its gate connected to one of the input Control Lines 262 from a single-poly EPROM 220. The activated lines of Lines 262 cause the corresponding capacitor, C, to be connected to the output of its associated inverter circuit (T1, T2). When a capacitor, C, is connected to an inverter output, it causes an increased delay through that section of the ring oscillator. The tandem connected Inverter and Switched Capacitor Circuits 350 form a feedback loop through NAND-gate 261 and Buffer I1. NAND-gate 261 acts as an enabling circuit that is controlled by a single-poly EPROM line. The frequency of oscillator, controlled by the time-delay around the loop, may be varied over a large range.

What is claimed is:

1. A microprocessor comprising:

a microprocessor core;

an electrically programmable non-volatile memory coupled for write access by said microprocessor core and having an address interface and a data interface, the address interface being coupled to receive an address from said microprocessor core;

a circuit coupled to receive one or more control signals from the data interface of said memory, the state of the one or more control signals being determined by a control value stored in said memory at the address received from said microprocessor core; and wherein said circuit is a bus interface circuit configured to interface said microprocessor with one of a plurality of differently configured buses based on the state of the one or more control signals.

2. A microprocessor comprising:

a microprocessor core;

an electrically programmable non-volatile memory coupled for write access by said microprocessor core and having an address interface and a data interface, the address interface being coupled to receive an address from said microprocessor core;

a circuit coupled to receive one or more control signals from the data interface of said memory, the state of the one or more control signals being determined by a control value stored in said memory at the address received from said microprocessor core; and wherein said circuit is a pin-out control circuit configured to define one of a plurality of different pin-out interfaces for said microprocessor based on the state of the one or more control signals.

3. A microprocessor comprising:

a microprocessor core;

an electrically programmable non-volatile memory coupled for write access by said microprocessor core and having an address interface and a data interface, the address interface being coupled to receive an address from said microprocessor core;

a circuit coupled to receive one or more control signals from the data interface of said memory, the state of the one or more control signals being determined by a control value stored in said memory at the address received from said microprocessor core;

a floating point processor; and wherein said circuit is a control circuit configured to either enable or disable said floating point processor based on the state of the one or more control signals.

4. A microprocessor comprising:

a microprocessor core;

an electrically programmable non-volatile memory coupled for write access by said microprocessor core and having an address interface and a data interface, the address interface being coupled to receive an address from said microprocessor core;

a circuit coupled to receive one or more control signals from the data interface of said memory, the state of the one or more control signals being determined by a control value stored in said memory at the address received from said microprocessor core; and wherein said circuit is a control circuit configured to establish an operating frequency for said microprocessor based on the state of the one or more control signals.

5. A microprocessor comprising:

a microprocessor core;

an electrically programmable non-volatile memory coupled for write access by said microprocessor core and having an address interface and a data interface, the address interface being coupled to receive an address from said microprocessor core;

a circuit coupled to receive one or more control signals from the data interface of said memory, the state of the one or more control signals being determined by a control value stored in said memory at the address received from said microprocessor core; and wherein said circuit is a control circuit configured to trim the output of a component in said microprocessor based on the state of the one or more control signals.

6. The microprocessor of claim 5 wherein the component in said microprocessor is a reference voltage circuit.

7. The microprocessor of claim 6 wherein said control circuit is configured to trim the output of the reference voltage circuit by coupling one or more resistive elements to the reference voltage circuit based on the state of the one or more control signals.

8. The microprocessor of claim 5 wherein the component in said microprocessor is an oscillator circuit.

9. The microprocessor of claim 8 wherein said control circuit is configured to trim the output of the oscillator circuit by coupling one or more capacitive elements to the oscillator circuit based on the state of the one or more control signals.

10. A microprocessor comprising:

a microprocessor core;

a cache memory coupled to said microprocessor core;

an electrically programmable non-volatile memory coupled for write access by said microprocessor core and having an address interface and a data interface, the address interface being coupled to receive an address from said microprocessor core;

a circuit coupled to receive one or more control signals from the data interface of said non-volatile memory, the state of the one or more control signals being determined by a control value stored in said non-volatile memory at the address received from said microprocessor core; and wherein said circuit is a cache repair unit to remap an address to a defective storage element in said cache memory to address a storage element indicated by the one or more control signals.

11. The microprocessor of claim 10 wherein the storage element indicated by the one or more control signals is a redundant storage element in said cache memory.

* * * * *